United States Patent
Martinez

(10) Patent No.: US 6,870,741 B2
(45) Date of Patent: Mar. 22, 2005

(54) SYSTEM FOR REDUCING APPARENT HEIGHT OF A BOARD SYSTEM

(75) Inventor: Paul Aurelio Martinez, San Diego, CA (US)

(73) Assignee: Kyocera Wireless Corp., San Diego, CA (US)

(*) Notice: Subject to any disclaimer, the term of this patent is extended or adjusted under 35 U.S.C. 154(b) by 0 days.

(21) Appl. No.: 10/420,269

(22) Filed: Apr. 22, 2003

(65) Prior Publication Data

US 2003/0156394 A1 Aug. 21, 2003

Related U.S. Application Data

(63) Continuation of application No. 09/943,954, filed on Aug. 31, 2001, now abandoned.

(51) Int. Cl.[7] .................................................. H05K 1/18
(52) U.S. Cl. ....................................... 361/761; 361/807
(58) Field of Search ................................. 361/760–761, 361/807–810; 174/260–264

(56) References Cited

U.S. PATENT DOCUMENTS

| | | | | |
|---|---|---|---|---|
| 2,945,163 A | * | 7/1960 | Kilby et al. | 361/761 |
| 5,455,741 A | * | 10/1995 | Wai et al. | 361/761 |
| 5,578,525 A | * | 11/1996 | Mizukoshi | 29/840 |
| 6,294,971 B1 | * | 9/2001 | Martich | 335/151 |

* cited by examiner

*Primary Examiner*—Kamand Cuneo
*Assistant Examiner*—Tuan Dinh

(57) ABSTRACT

A system for reducing an apparent height of a board system is provided. The board system may include, for example, a carrier, a component, a printed circuit board and/or a solder material. The component is mounted on a first side of the carrier. The printed circuit board has a hole that is structured to accommodate the component. The solder material solders the carrier to the printed circuit board and provides a structural bond between the carrier and the printed circuit board. At least one portion of the solder material provides an electrical coupling between the carrier and the printed circuit board and at least one portion of the component is maintained in the hole after the carrier is soldered to the printed circuit board.

20 Claims, 6 Drawing Sheets

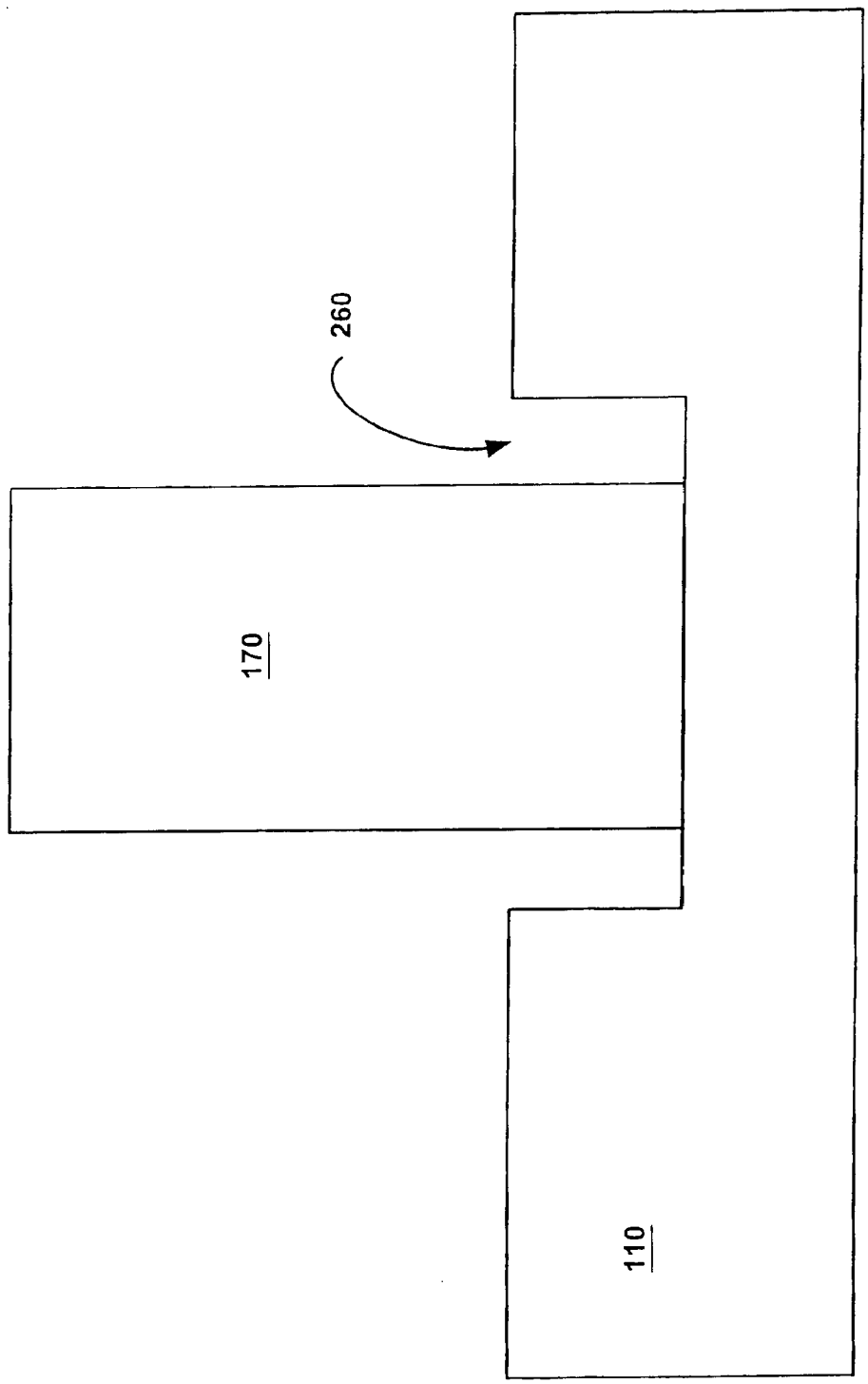

SYSTEM FOR REDUCING APPARENT HEIGHT OF A BOARD SYSTEM

RELATED APPLICATIONS AND PRIORITY CLAIM

This application claims priority to and is a continuation application of U.S. patent application Ser. No. 09/943,954 filed Aug. 31, 2001 now abandoned incorporated herein by reference.

FIELD OF THE INVENTION

The present invention generally relates to a system for reducing apparent height of a board system.

BACKGROUND OF THE INVENTION

Space is always at a premium in an electronic housing. For example, as the technology in the wireless communications industry improves, the wireless communications devices and, in particular, the housings of the wireless communications devices are becoming more miniaturized. The shrinking dimensions of the housing are in stark contrast to the increasing dimensions and, in particular, the increasing height of some components on the main board of the wireless communications device that are becoming more powerful and are being asked to perform multiple complex tasks.

Conventional solutions may include, for example, using larger housing dimensions or using less powerful components which have smaller dimensions. Such conventional solutions are often inconvenient and undesirable to consumers. Alternatively, the cost of the wireless communications devices can be increased dramatically by researching, developing and marketing a powerful component that has smaller dimensions. However, in a competitive arena such as the wireless communications industry, consumers may be reluctant to absorb such additional costs.

In another example, computer industry standards relating to the dimensions of a printed circuit board (e.g., motherboards, expansion boards) have already been set. Accordingly, as computer tasks become more intricate, the hardware mounted on the printed circuit boards also becomes more complex. As components mounted on the printed circuit board become more powerful, the size and, in particular, the height of the components becomes greater. In some cases, the apparent height of the component may exceed the standard dimensions. Thus, the printed circuit board with component mounted thereon may not fit in the standard board slot or electronic housing.

The conventional solutions have proven to be unsatisfactory. For example, by using less powerful components with, for example, shorter dimensions, the printed circuit board can fit in the standard electronic housing or board slot. However, such a technique fails to take advantage of available and more powerful components. Alternatively, conventional methods may include designing custom electronic housings or custom board slots. Such conventional methods have a disadvantage of being costly and incompatible with industry adopted standards and with components and/or parts that adhere to the industry adopted standards. In still another alternative, the cost and time to market of the computer or server can be increased dramatically by researching, developing and marketing a powerful component that has smaller dimensions. The computer industry is another competitive arena in which costs are reluctantly absorbed by consumers and in which the technology is changing so rapidly that the costs in time and the risks of obsolescence can be quite significant.

SUMMARY OF THE INVENTION

The present invention provides a system for reducing apparent height of a board system and alleviates to a great extent the disadvantages of conventional systems.

In an exemplary embodiment, the present invention may include, for example, a carrier, a component, a printed circuit board and/or a solder material. The component is mounted on a first side of the carrier. The printed circuit board has a hole that is structured to accommodate the component. The solder material solders the carrier to the printed circuit board and provides a structural bond between the carrier and the printed circuit board. At least one portion of the solder material provides an electrical coupling between the carrier and the printed circuit board and at least one portion of the component is maintained in the hole after the carrier is soldered to the printed circuit board.

The present invention has an advantage of reducing an apparent height of the component on a printed circuit board and/or reducing a total height of a board system. Thus, for example, components, that typically could not be mounted on a printed circuit board due to particular space limitations within a housing, can be added to the printed circuit board without exceeding the particular space limitations.

These and other features and advantages of the present invention will be appreciated from review of the following detailed description of the present invention, along with the accompanying figures in which like reference numerals refer to like parts throughout.

BRIEF DESCRIPTION OF THE DRAWINGS

FIG. 6 shows a side view illustrating an exemplary embodiment of the board system according to the present invention.

DETAILED DESCRIPTION OF THE INVENTION

Figure 1:
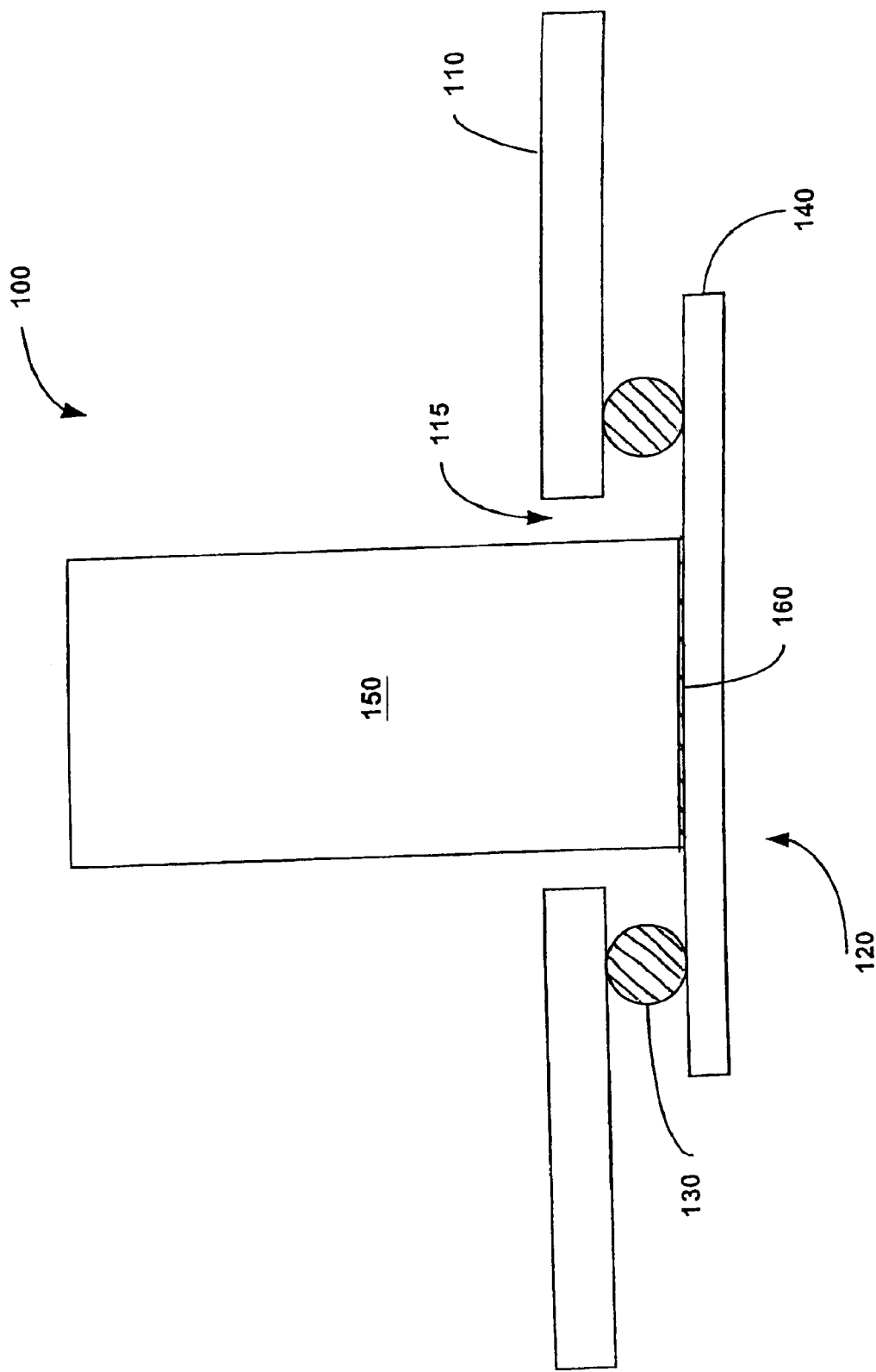
FIG. 1 shows a side view illustrating an exemplary embodiment of a board system according to the present invention.

FIG. 1 shows an exemplary embodiment of a system for reducing apparent height of a board system 100 according to the present invention. The board system 100 may include, for example, a printed circuit board (PCB) 110, a carrier system 120 and/or a solder material 130. The carrier system 120 may include, for example, a carrier 140, a component 150 and/or a paste material 160. The component 150 is coupled to the carrier 140 via the paste material 160 or via conventional coupling means known to one of ordinary skill in the art. The paste material 160 may provide an electrical connection between the component 140 and the carrier 140. The PCB 110 may include, for example, a hole that is structured to accommodate the component 150. When the carrier system 120 is coupled to the PCB 110 via the solder material 130, the component 150 may be, at least partly, disposed in the hole 115 of the PCB 110. The solder material 130 may provide a structural bond between the carrier system 120 and the PCB 110. In addition, at least a portion of the solder material 130 may provide an electrical coupling between the carrier system 120 and the PCB 110 and, in particular, between the carrier 140 and the PCB 110. Accordingly, an electrical path is formed between the component 150 and the PCB 110 via the paste material 160, the carrier 140 and the solder material 130. This electrical path may be the sole electrical path between the component 150 and the PCB 110.

Figure 2:
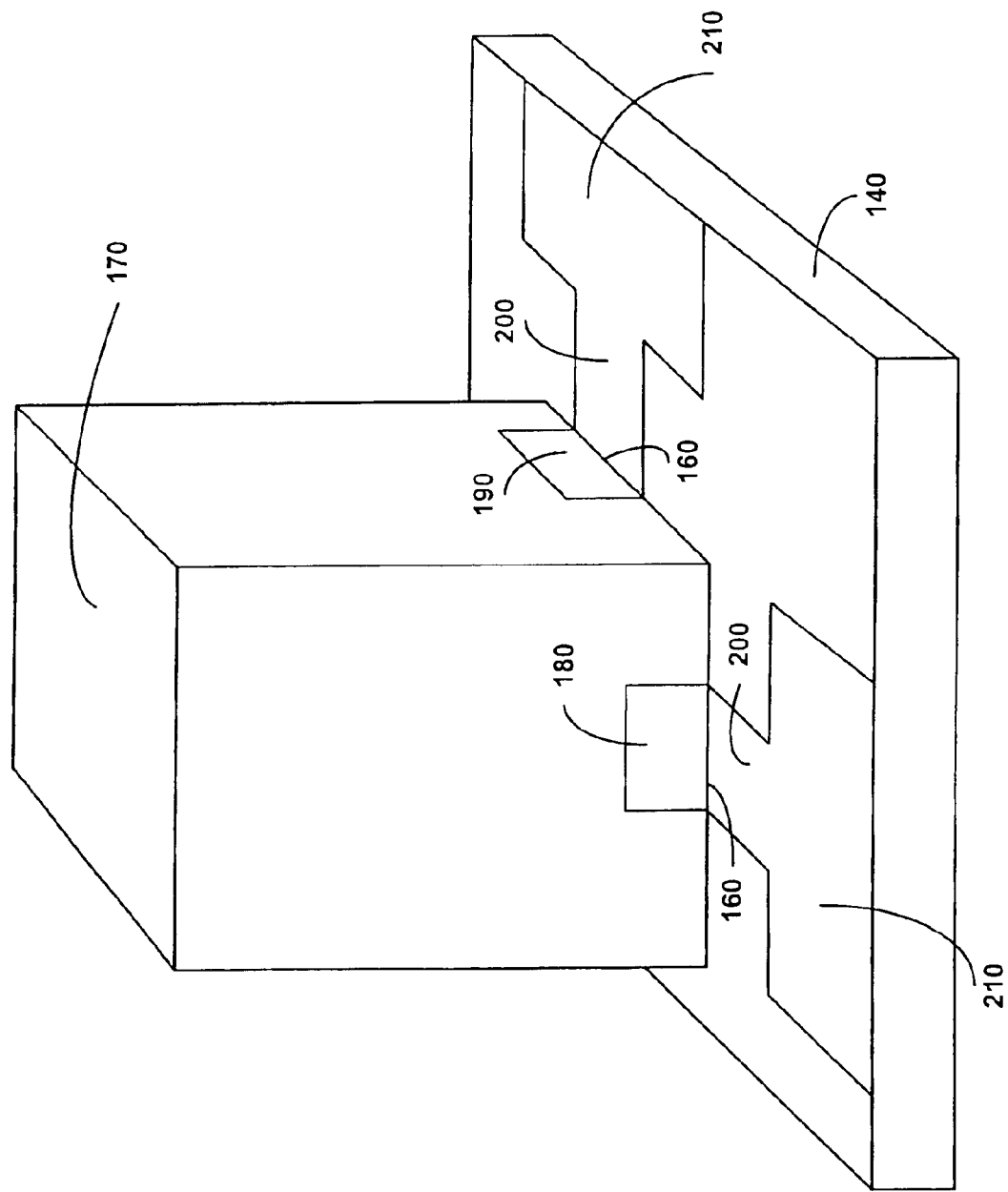
FIG. 2 shows a perspective view illustrating an exemplary embodiment of a carrier system according to the present invention.

In an exemplary embodiment, the system 100 may be part of a larger system such as, for example, a computer system, a wireless communications system or any other system that employs printed circuit boards. Thus, for example, a wireless communications device may include, for example, an antenna that is coupled to the component 150 such as, for example, a duplexer 170, via the PCB 110. As illustrated in FIG. 2, the duplexer 170 may include a plurality of ports of which only two 180, 190 are shown. Although shown on side walls of the duplexer 170, the ports may be disposed any of the walls of the duplexer 170 and may extend across combinations of walls. In the duplexer 170, one of the ports 180 may be reserved, for example, as an input or an output for the antenna the wireless communications device. Another port 190 may be dedicated, for example, as an output port for a reception branch of the communications circuitry mounted or printed on the PCB 110. In yet another port, the duplexer 170 may be dedicated, for example, as an output port for a transmission branch of the communications circuitry, for example, mounted or printed on the PCB 110. Other ports may also be provided such as, for example, an electrical ground port, which are well known to one of ordinary skill in the art, but are not described further herein.

As shown in FIG. 2, the paste material may be spread across the base of the duplexer 170. The paste material 160 may be spread across the entire base of the duplexer 170 or in portions of the base of the duplexer 170. For example, if a port is located on the base of the duplexer 170 or if the port 180, 190 extends from the side wall of the duplexer 170 to a portion of the base, then the paste material 160 may be spread in the region of that portion of the base. If applicable, the paste material 160 may be exposed to raised temperatures which aid in melting the paste material 160. As the paste material 160 cools, it can, for example, harden into a structural bond. The paste material 160 may also provide an electrical connection between the duplexer 170 and the carrier 140. For example, the carrier 140 may include electrical traces 200 and pads 210. The electrical traces 200 may extend beneath the duplexer 170. The paste material 160 may provide the electrical connection between the ports 180, 190 of the duplexer 170 and the electrical traces 200 and pads 210 of the carrier 140.

Figure 3:
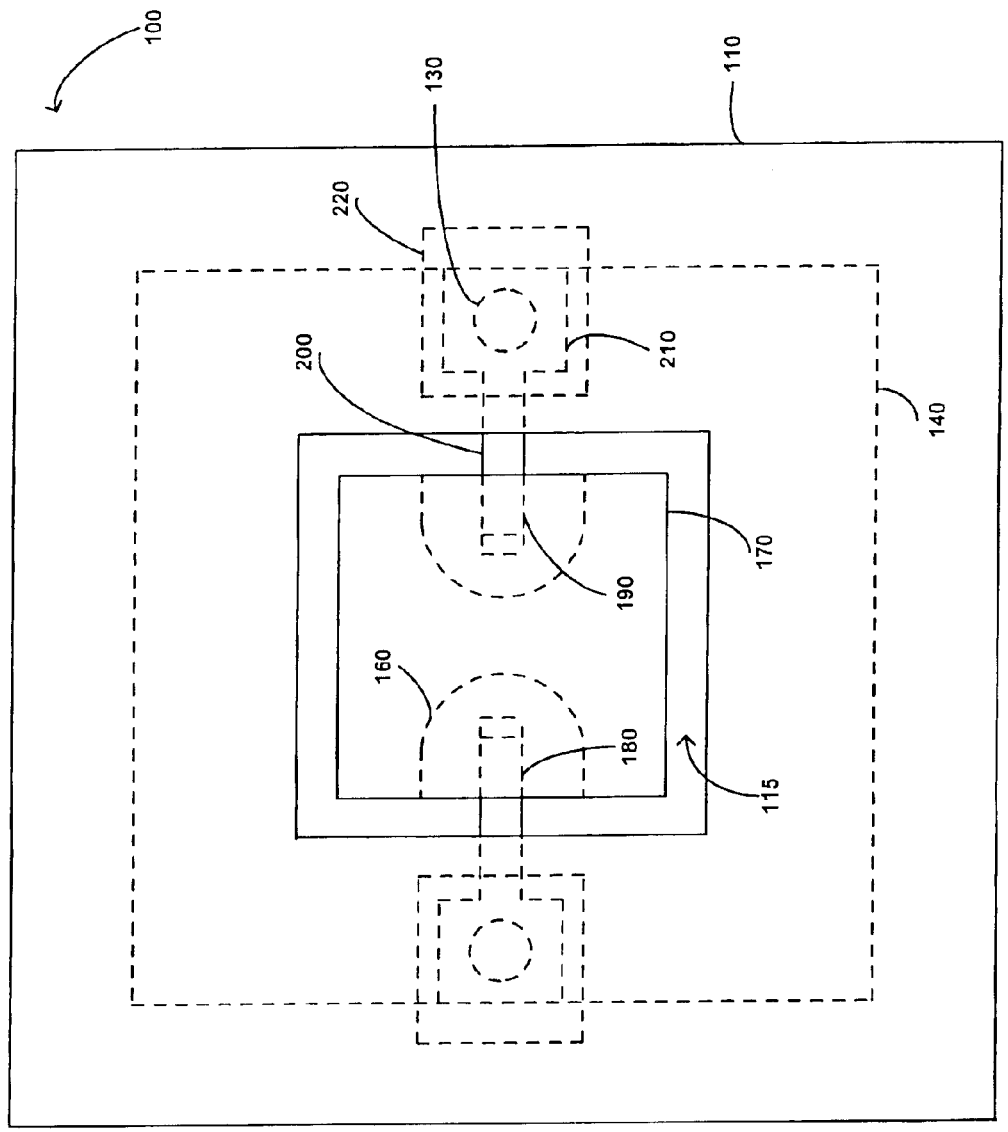
FIG. 3 shows a top view illustrating an exemplary embodiment of the board system according to the present invention.

FIG. 3 illustrates a top view of another exemplary embodiment of the board system 100 according to the present invention. The duplexer 170 is illustrated as having two ports 180, 190 (although the duplexer 170 may have additional ports not shown). The ports 180, 190 are disposed on the base of the duplexer 170, but may also extend to, for example, a side wall of the duplexer 170 or may entirely be disposed on a side wall of the duplexer 170. The paste material 160 is spread across portions of the base of the duplexer 170 that are in the region of the ports 180, 190. The duplexer 170 is mounted on the carrier 140 such that the ports 180, 190 come in contact with or are coupled to the traces 200 of the carrier 140. The paste material 160, which may be heated to at least its melting temperature and then cooled, may provide a structural bond between the duplexer 170 and the carrier 140. In addition, the paste material 160 may also provide an electrical connection between the ports 180, 190 and the traces 200. For example, the paste material 160 may include solder material.

The PCB 110 includes the hole 115 through which the duplexer 170 at least partly extends as illustrated in FIG. 3. The PCB 110 is also shown with electrical pads 220 disposed on a bottom side of the PCB 110. Although not shown, the electrical pads 220 are coupled to other circuitry and/or components disposed on the PCB 110. A portion of the solder material 130 is diposed on at least a portion of the electrical pads 210 of the carrier 140. The solder material 130 may be in the form, for example, of a ball, bump and/or mass. The carrier system 120 is brought up towards the PCB 110 such that the solder material 130 is in contact with the electrical pad of the PCB 110. The solder material 130 is heated to at least its melting temperature before being cooled. The solder material 130 may, for example, have a lower melting temperature than the paste material 160. Thus, the solder material 130 may be heated to a temperature that is at least above the melting temperature of the solder material 130, but that is below the melting temperature of the paste material 160.

Thus, the solder material 130 may provide a structural bond as well as an electrical connection between the electrical pads of the carrier 140 and the electrical pads of the PCB 110. In fact, the solder material 130 may provide the only structural bond between the carrier 140 and the PCB 110. The solder material 130 may provide the only electrical connection between the carrier 140 and the PCB 110. Thus, the solder material 130 may provide the only electrical connection between the duplexer 170 and the PCB 110.

Figure 4A:
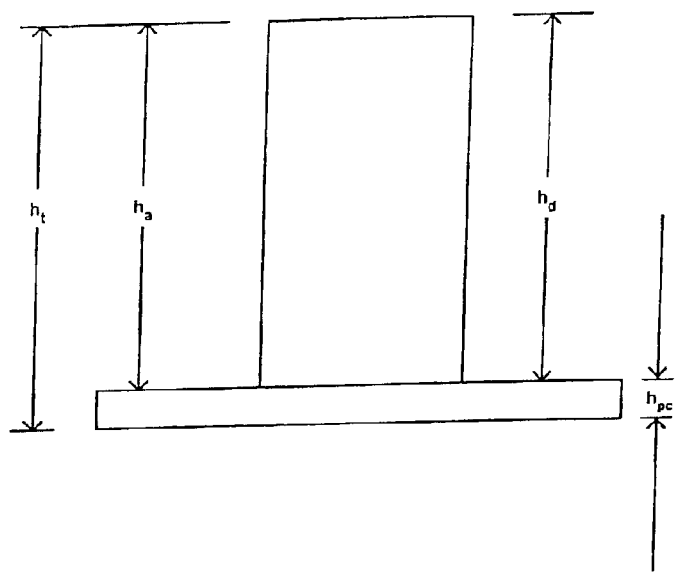
FIG. 4A shows a side view illustrating a conventional board system.

FIG. 4a shows a conventional board system with the duplexer 170 mounted on the PCB 110. Illustrated heights include a duplexer height $h_d$ and a PCB height $h_{pc}$. Accordingly, a total height ht of the board system may be given by the relation:

$$h_t = h_d + h_{pc}.$$

The apparent height $h_a$, which extends from the PCB 110 to the top of the duplexer 170, is given by the relation:

$$h_a = h_d.$$

Figure 4B:
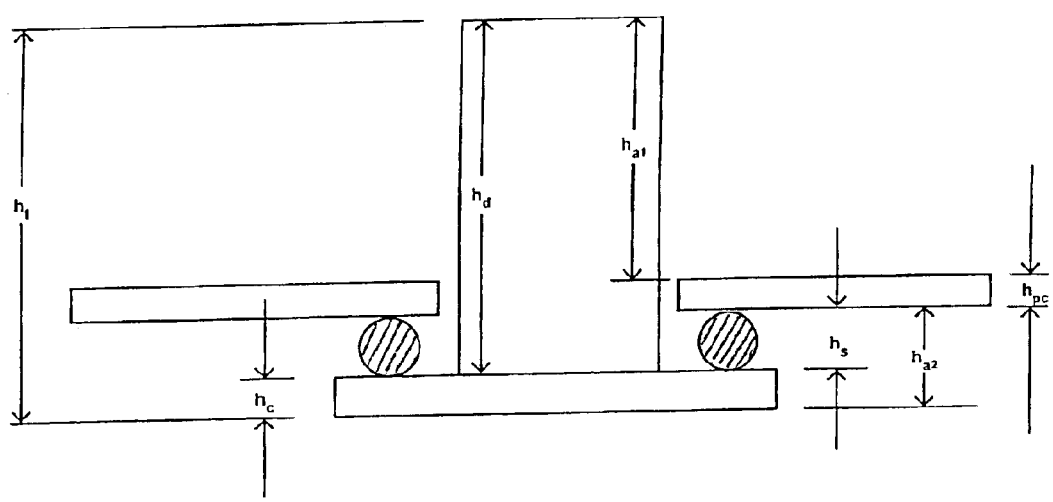
FIG. 4B shows a side view illustrating an exemplary embodiment of the board system according to the present invention.

FIG. 4b shows an exemplary embodiment of the board system 100 according to the present invention. Illustrated heights include the duplexer height $h_d$, the PCB height $h_{pc}$, a carrier height $h_c$ and a solder material height $h_s$. Accordingly, a total height $h_t$ of the board system 100 may be given by the relation:

$$h_t = h_d + h_c.$$

In an exemplary embodiment, the carrier height $h_c$ of the board system 100 may be less than the PCB height $h_{pc}$, thus the total height $h_t$ of the board system 100 is less than the total height $h_t$ of the conventional board system. In addition, the board system 100 has a first apparent height $h_{a1}$, which extends from the PCB 110 to the top of the duplexer 170, and a second apparent height $h_{a2}$, which extends from the bottom of the PCB 110 to the bottom of the carrier 140, that may be given by the relations:

$$h_{a1}=h_d-h_{pc}-h_s, \text{ and}$$

$$h_{a2}=h_s+h_c.$$

The first apparent height $h_{a1}$ is definitely less than the apparent height of the conventional board system. Furthermore, the second apparent height $h_{a2}$ is typically less than the apparent height of the conventional board system since the solder material height $h_s$ and the printed circuit board height $h_{pc}$ are usually much smaller than duplexer height $h_d$.

Figure 5:
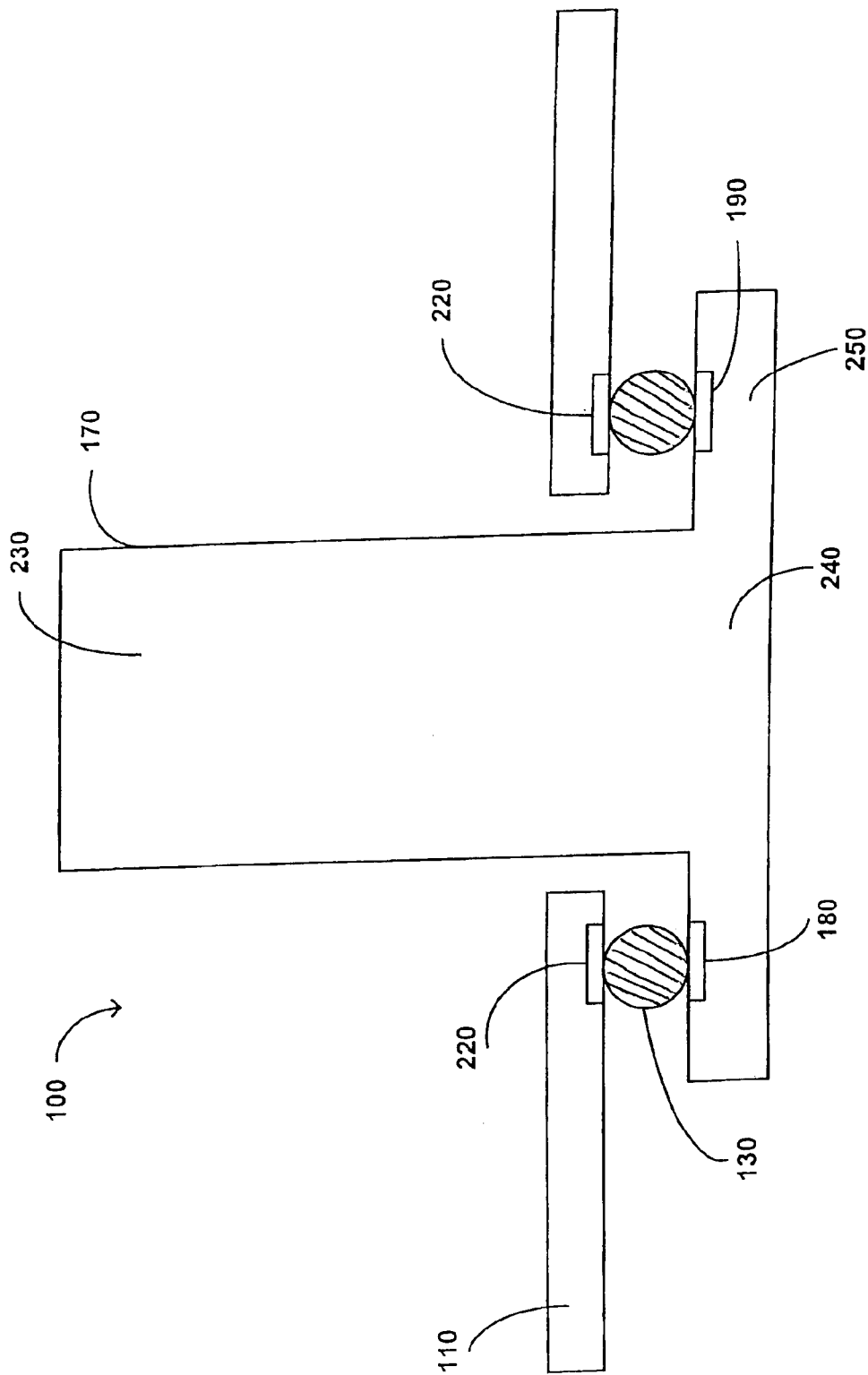
FIG. 5 shows a side view illustrating an exemplary embodiment of the board system according to the present invention.

FIG. 5 illustrates another exemplary embodiment of the board system 100 according to the present invention. The duplexer 170 has been modified to include a first portion 230 and a second portion 240. The second portion 240 includes a protrusion 250 that may extend laterally beyond the lateral reach of the first portion 230. Duplex ports 180, 190 may be disposed on, for example, at least the top of the protrusion 250. Accordingly, the solder material 130 can couple structurally and/or electrically the duplex ports 180, 190 to the electrical pads of the 220 of the PCB 110. The modified structure of the duplexer 170 reduces the need for using the carrier 140.

FIG. 6 illustrates another exemplary embodiment of the board system 100 according to the present invention. The board system 100 includes the PCB 110 which includes a recess 260. The recess 260 may be formed via molding, cutting, shaving or any other method known to one of ordinary skill in the art. The duplexer 170 is mounted on the PCB 110 in the recess 260. The electrical coupling of the duplexer 170 to the PCB 110 may be achieved using, for example, conventional methods known to one of ordinary skill in the art.

Thus, it is seen that systems for reducing apparent height of a board with a component are provided. One skilled in the art will appreciate that the present invention can be practiced by other than the preferred embodiments which are presented in this description for purposes of illustration and not of limitation, and the present invention is limited only by the claims that follow. It is noted that equivalents for the particular embodiments discussed in this description may practice the present invention as well.

What is claimed is:

1. A system for reducing apparent height of a board system, comprising:
   a printed circuit board comprising:
      a top surface;
      a bottom surface;
      an opening extending through the circuit board from the top surface to the bottom surface, the opening having an opening width to accommodate a component; and
      a plurality of electrical pads located on the bottom surface and adjacent the opening; and
   the component comprising:
      an upper portion having an upper width less than the opening width, the upper portion extending through the opening;
      a lower portion having a lower width greater than the opening width, the lower portion extending below the bottom surface of the printed circuit board; and
      at least one component port located on the lower portion of the component and aligned with at least one electrical pad of the plurality of electrical pads; and
   solder material for soldering the at least one component port to the at least one electrical pad.

2. A system for reducing apparent height of a board system, comprising:
   a component having a first portion and a second portion, the second portion having a lateral protrusion with a protrusion width;
   a printed circuit board comprising:
      a top surface;
      a bottom surface;
      a hole extending through the printed circuit board from the too surface to the bottom surface, the hole having a hole width structured to accommodate the first portion of the component, the hole width less than the protrusion width such that the lateral protrusion extends beyond the hole and below the bottom surface; and
   a solder material soldering the printed circuit board to the lateral protrusion and providing a structural bond between the component and the printed circuit board, at least one portion of the solder material providing an electrical coupling between the component and the printed circuit board,
   wherein at least part of the first portion of the component is maintained in the hole after the component is soldered to the printed circuit board.

3. The system of claim 2,
   wherein the circuit board further comprises at least one electrical board pad on the bottom surface and position adjacent the hole;
   wherein the lateral protrusion comprises at least one electrical protrusion pad that aligns with the at least one electrical board pad; and
   wherein the solder material solders the at least one electrical board pad to the at least one electrical protrusion pad.

4. The system of claim 2, wherein the lateral protrusion extends around a periphery of the second portion.

5. The system of claim 2, wherein the lateral protrusion extends from a bottom surface of the second portion of the component.

6. The system of claim 2, wherein the component has a component height and the printed circuit board has a board thickness, and wherein the board system has a board system height equal to the component height, and wherein the board system height is less than the component height added to the board thickness.

7. The system of claim 5, wherein the lateral protrusion further extends around a periphery of the bottom surface.

8. A circuit board assembly, comprising:
   a circuit board comprising:
      a first surface,
      a second surface,
      an opening extending through the circuit board from the first surface through the second surface, the opening having an opening width, and
      at least one electrical pad on the first surface and adjacent the opening,
   a component situated in the opening, the component comprising:
      a first portion with a first width less than the opening width, the first portion extending through the opening; and
      a second portion having at least one protrusion with a second width greater than the opening width such that the second portion extends beyond the opening to the first surface of the circuit board, the at least one protrusion having at least one protrusion surface such that the at least one protrusion surface aligns with the at least one electrical pad when the component is situated in the opening; and solder material for soldering the at least one electrical pad to the at least one protrusion surface, the solder material for providing a structural bond between the component and the circuit board.

9. The circuit board assembly of claim 8, wherein the at least one protrusion surface comprises at least one protrusion pad such that the at least one protrusion pad aligns with the at least one electrical pad when the component is situated in the opening.

10. The circuit board assembly of claim 8, wherein circuit board further comprises a printed circuit connected to the at least one electrical pad, wherein the at least one protrusion surface provides an electrical connection to the component, and wherein the solder material further electrically connects the printed circuit to the component.

11. The circuit board assembly of claim 8, wherein the at least one protrusion extends around a periphery of the second portion of the component such that the at least one protrusion cannot pass through the opening.

12. The circuit board assembly of claim 8, wherein the at least one protrusion extends from a bottom surface of the second portion of the component.

13. The circuit board assembly of claim 8, wherein the at least one protrusion is electrically conductive such that soldering the at least one protrusion to the at least one electrical pad provides an electrical connection between the component and the electrical pad.

14. A wireless communication device, comprising:
a circuit board comprising:
   a top surface,
   a bottom surface,
   an opening extending from the top surface through the bottom surface, the opening having an opening width, and
   at least one electrical pad on the bottom surface and adjacent the opening,
a component situated in the opening, the component comprising:
   an upper portion with a first width less than the opening width, the upper portion extending through the opening; and
   a lower portion having at least one protrusion with a second width greater than the opening width such that the lower portion is positioned below the bottom surface of the circuit board, the at least one protrusion having at least one protrusion pad on a protrusion upper surface such that the at least one protrusion pad aligns with the at least one electrical pad when the component is situated in the opening; and solder material for soldering the at least one electrical pad to the at least one protrusion pad, the solder material for providing a structural bond between the component and the circuit board.

15. The wireless communication device of claim 14, wherein the circuit board further comprises at least one circuit connected to the at least one electrical pad, and wherein the solder material further provides an electrical bond between the component and at least one circuit on the circuit board.

16. The wireless communication device of claim 14, wherein the at least one protrusion extends around a periphery of the lower portion of the component.

17. A method of assembling a board system comprising the steps of:
   providing a circuit board having a first surface and a second surface;
   providing an opening in the circuit board extending through the first surface and the second surface, the opening having an opening width;
   providing at least one board solder pad on the second surface of the circuit board and adjacent the opening of the circuit board;
   providing a component comprising: an upper portion with a first width less than the opening width; and a lower portion with a second width greater than the opening width;
   placing the upper portion of component through the opening by way of the second surface; and
   soldering at least one surface area of the lower portion of the component to the at least one board solder pad.

18. The method of claim 17, wherein the upper portion and lower portion of the component are centered with respect to a center vertical axis of the component such that the lower portion extends equidistantly outward from the upper portion.

19. The method of claim 17, further comprising the step of:
   providing at least one component solder pad on the at least one surface area of the lower portion; and
   wherein the step of soldering comprises the step of soldering the at least one component solder pad to the at least one board solder pad to provide an electrical connection between the circuit board and the component.

20. The method of claim 17, wherein the component has a component height, and the circuit board has a board thickness, and wherein the assembled board system has a board system height equal to the component height.

* * * * *

UNITED STATES PATENT AND TRADEMARK OFFICE
CERTIFICATE OF CORRECTION

PATENT NO. : 6,870,741 B2
DATED : March 22, 2005
INVENTOR(S) : Martinez, Paul A.

It is certified that error appears in the above-identified patent and that said Letters Patent is hereby corrected as shown below:

<u>Title page,</u>
Item [63], Related U.S. Application Data, change "Continuation of application No. 09/943,954, filed on Aug. 31, 2001, now abandoned" to -- Continuation of application No. 09/943,954, filed on Aug. 31, 2001, now issued on October 11, 2005 as Patent No. US 6,954,362 B2. --.

Signed and Sealed this

Twenty-first Day of March, 2006

JON W. DUDAS
*Director of the United States Patent and Trademark Office*